United States Patent
Jensen et al.

(10) Patent No.: US 7,915,676 B2
(45) Date of Patent: Mar. 29, 2011

(54) INTEGRATED CIRCUIT

(75) Inventors: Nils Jensen, Munich (DE); Marie Denison, Munich (DE)

(73) Assignee: Infineon Technologies AG, Munich (DE)

( * ) Notice: Subject to any disclaimer, the term of this patent is extended or adjusted under 35 U.S.C. 154(b) by 863 days.

(21) Appl. No.: 11/186,402

(22) Filed: Jul. 21, 2005

(65) Prior Publication Data
US 2006/0071236 A1 Apr. 6, 2006

(30) Foreign Application Priority Data

Jul. 23, 2004 (DE) .................. 10 2004 035 745

(51) Int. Cl.
*H01L 29/94* (2006.01)

(52) U.S. Cl. ........ 257/339; 257/355; 257/409; 257/487; 257/494; 257/546; 257/E29.008; 257/E29.014

(58) Field of Classification Search .................. 257/133, 257/335, 345, 339, 492, 493, 341, 355, 409, 257/487, 494, 546, E29.008, E29.014
See application file for complete search history.

(56) References Cited

U.S. PATENT DOCUMENTS

| 5,374,565 A | 12/1994 | Hsue et al. |
| 6,171,891 B1 | 1/2001 | Lee et al. |
| 6,274,918 B1 * | 8/2001 | Tsai et al. ..................... 257/492 |
| 6,713,816 B1 | 3/2004 | Wolf et al. |

FOREIGN PATENT DOCUMENTS

| DE | 197 46 410 C2 | 11/1999 |
| DE | 100 06 519 B4 | 3/2004 |
| EP | 0 905 782 A1 | 3/1999 |
| EP | 0905782 A1 * | 3/1999 |

* cited by examiner

*Primary Examiner* — Matthew E Warren
(74) *Attorney, Agent, or Firm* — Maginot, Moore & Beck (57) ABSTRACT

The invention relates to an integrated circuit having a semiconductor component (10) comprising a first p-type region (12) and a first n-type region (11) adjoining the first p-type region (12), which together form a first pn junction having a breakdown voltage. According to the invention, a further n-type region adjoining the first p-type region or a further p-type region (13) adjoining the first n-type region (11) is provided, the first p-type or n-type region (11) and the further n-type or p-type region (13) adjoining the latter together forming a further pn junction having a further breakdown voltage, the first pn junction and the further pn junction being connected or connectable to one another in such a way that, in the case of an overloading of the semiconductor component, on account of a current loading of the first pn junction, first of all the further pn junction breaks down.

10 Claims, 5 Drawing Sheets

INTEGRATED CIRCUIT

BACKGROUND

This invention relates to an integrated circuit having a semiconductor component.

Figure 6:
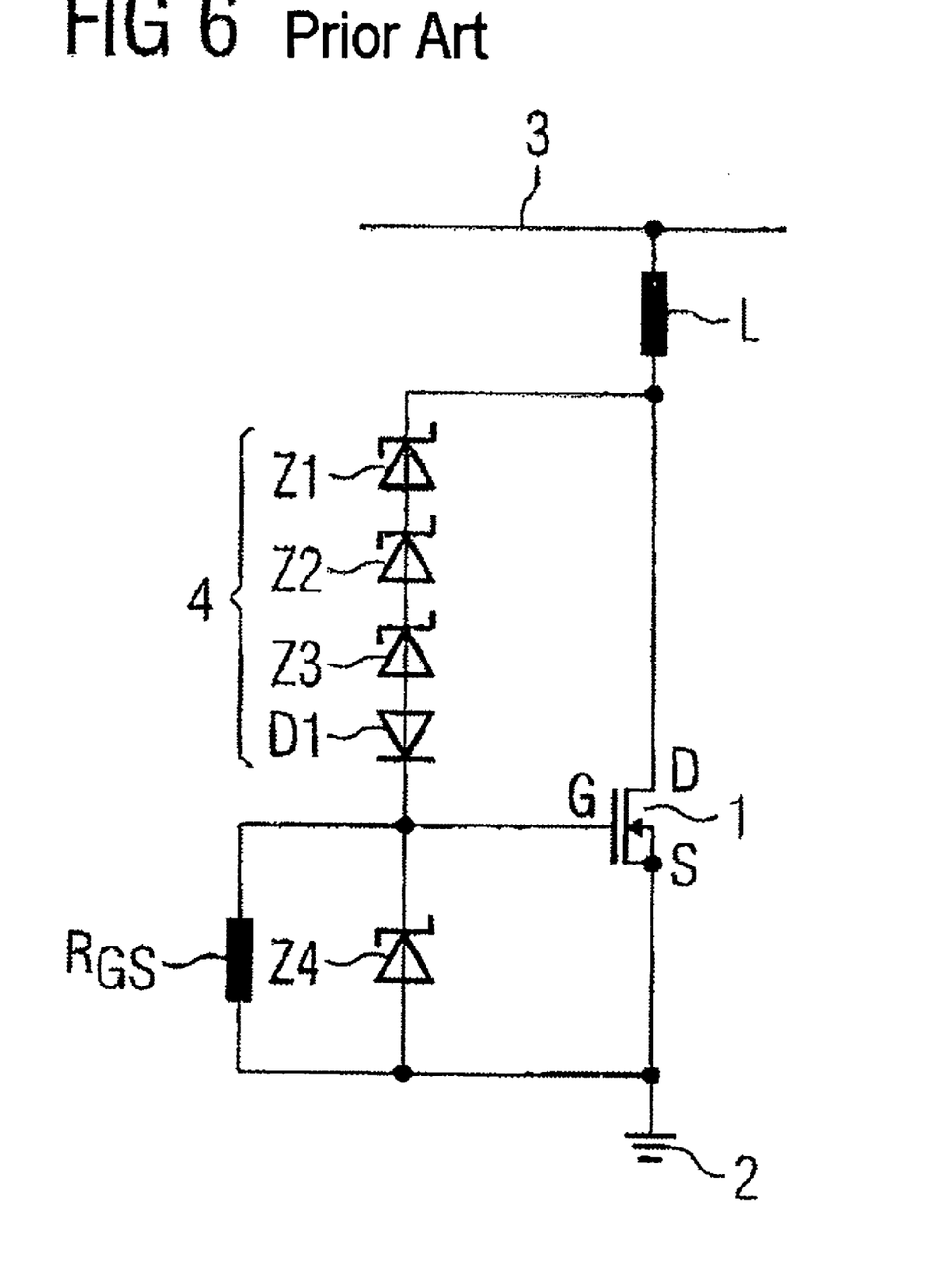
FIG. 6: shows a circuit arrangement for zenering in the commutation of an inductance by means of a low-side switch (prior art).

The commutation of inductive loads at low-side switches (dissipation of the energy of the coil load after the switch-off of the transistor) is generally effected by means of an active voltage limiting at the low-side switch. FIG. 6 shows by way of example a circuit arrangement in accordance with the prior art for the commutation of an inductive load L, in which a DMOS power transistor 1 is used as a low-side switch.

In this exemplary embodiment, the inductive load L is connected on one end side to a line 3 carrying operating potential. The other side of the load L is connected to a drain input D of the DMOS power transistor. A source input of the DMOS transistor is connected to a ground connection 2. A zener diode chain 4 having the zener diodes Z1, Z2, Z3 and, respectively, Z4 and acting as a voltage divider is in each case situated between the drain D and gate G and, respectively, a gatesource resistance $R_{GS}$, which turn on the low-side transistor 1 when the potential rises at the drain D.

Besides the loading during commutation, low-side switches protect themselves dependent on size up to a certain loading by electrostatic discharges (ESD) according to HBM (acronym for Human Body Model).

In view of the increasingly more stringent requirements made of the ESD durability at the IC level (acronym for integrated circuit), for instance given by the requirement for protection against pistol discharges according to IEC standard (discharge network approximately 150 pF and 330Ω compared with 1.5 kΩ and 100 pF in the case of HBM; standards: IEC 61000-4-2, JESD 22-A114-B), a self-protection of the low-side switch by means of active zenering is increasingly difficult to impossible depending on the required endurance with respect to pistol discharges. However, the protection of the low-side switch against ESD loading has to be safeguarded by means of a separate ESD structure. However, this is at odds with the requirement of commutation by means of the low-side switch since either the ESD structure or the active voltage limiting (active clamping) of the zener chain circuit accepts the loading both during commutation and in the ESD case.

SUMMARY

Disclosed herein is an integrated circuit having a semiconductor component having a pn junction in which the semiconductor component is protected against hard current loadings such as for instance pistol discharges which has only a small additional space requirement and which can be produced comparatively cost-effectively.

The invention is based quite generally on an integrated circuit (abbreviated to IC) having a semiconductor component which has a first p-conducting, in particular p-doped region and a first n-conducting, in particular n-doped region, adjoining the first p-conducting or p-doped region, the first n-conducting region and the first p-conducting region together forming a first pn junction having a breakdown voltage. Consequently, all types of diodes or transistors (bipolar transistors, field effect transistors, etc.) in an IC are taken into consideration as semiconductor components to which the invention relates. The arrangement of the semiconductor component in a plane (planar or lateral arrangement) or the extending of said semiconductor component into the depth (vertical arrangement) is unimportant, as is the type of substrate material used (silicon, germanium, gallium arsenide, sapphire, etc.).

The invention now provides a protective diode integrated into the integrated circuit. Accordingly, a further n-conducting region adjoining the first p-conducting region or a further p-conducting region adjoining the first n-conducting region is provided. The first p- or n-conducting region and the further n- or p-conducting region adjoining the latter together form a further pn junction having a further breakdown voltage. It is provided that the first pn junction and the further pn junction are connected or can be connected to one another in such a way that, in the case of an overloading of the semiconductor component on account of a current loading of the first pn junction first of all a breakdown is effected at the further pn junction, and that said further pn junction accepts the current to an extent that the semiconductor component is not destroyed. It shall again be clarified hereby that the first pn junction can likewise break down. The current loading thereof is kept so small, however, that the semiconductor component is not destroyed.

In the case of a low-side transistor as semiconductor component, the ESD protective diode of the component to be protected and also the energy-dissipating structure during the commutation process are accordingly combined. This avoids the problem that the low-side transistor, in the case of active clamping, accepts the current in the ESD case and is destroyed by overloading. Moreover, the active voltage limiting (clamping) of the low-side transistor by means of a zener diode chain is obviated in this case.

It shall be expressly pointed out again that the principle according to the invention can also be applied to high-side switches. The circuit arrangement according to the invention can be used in any case where the energy to be dissipated is too high for the semiconductor component, in particular the switch, and where the intention is to avoid significantly enlarging the chip area through the use of diodes connected in parallel separately with the semiconductor component (e.g. a switch).

In the simplest case, if the first pn junction is connected or can be connected (directly) in parallel with the further pn junction, it is appropriate to choose the further breakdown voltage to be less than the first breakdown voltage. This ensures that the further pn junction always breaks down before the first pn junction. Voltage drops on line sections or other (in particular nonreactive) resistances then need not be used for the dimensioning of the integrated circuit.

According to the invention, it is provided that additional n-conducting and/or p-conducting regions, in particular defining the active semiconductor component to be protected, are arranged within the first region of the p-conduction type and/or within the first n-conducting region. By way of example, the component to be protected may have an outer well of the n-conduction type whose breakdown to an inner well of the p-conduction type is to be protected. Further regions of the n- or p-conduction type, which define the active structure to be protected, may then be arranged within the well of the p-conduction type. By way of example, the structure to be protected may be a vertical MOS transistor (acronym for metal oxide semiconductor) or a vertical npn-bipolar transistor.

In a particularly advantageous embodiment variant of the invention it is provided that the first p- or n-conducting region is a base region of a (planar or vertical) bipolar transistor and/or a body region of a (planar or vertical) field effect transistor and/or an anode or cathode region of a (planar or vertical) diode.

In order to minimize the space requirement on the chip (or the other semiconductor geometry) it is provided according to the invention that the first pn junction and the further pn junction have one common connection contact (anode or cathode of the protective diode) or even two common connection contacts (anode and cathode of the protective diode). In order to be able to set the properties of the integrated protective diode in a targeted manner, it is provided according to the invention that the further n- or p-conducting region (if appropriate in the same way as the first p- or n-conducting region of the semiconductor component) has a plurality of zones (preferably of the same conduction type, however) having different doping concentrations.

For the same reason, it is provided according to the invention that the further n-type or p-type region comprises a plurality of locally separated partial regions.

In particular, the magnitude of the breakdown voltage (and associated with this the precise location of the breakdown) of the further pn junction may, according to the invention, be set to a predetermined value by means of the spatial extent of the zones and/or the spatial extent of the partial regions and/or the spatial arrangement of the zones with respect to one another and/or the spatial arrangement of the partial regions with respect to one another and/or the doping concentrations of the zones or the ratio thereof with respect to one another and/or the doping concentrations of the partial regions or the concentration ratios thereof with respect to one another and/or the geometrical shape of the zones and/or the geometrical shape (round, polygonal) of the partial regions.

For space reasons it may further be provided that the further n- or p-conducting region is arranged within the first p- or n-conducting region and/or is enclosed by the latter.

BRIEF DESCRIPTION OF THE DRAWINGS

The invention will now be described in more detail with reference to the drawings:

FIG. 1: shows three exemplary embodiments of an integrated circuit with a simple protective diode according to the invention. All connections of the semiconductor component and of the protective diode are realized on the same chip surface
- a) the semiconductor component is a vertical npn-bipolar transistor,
- b) the semiconductor component is a VDMOS field effect transistor (acronym for vertical double diffused MOS)
- c) the semiconductor component is an LDMOS field effect transistor (acronym for lateral double diffused MOS).

FIG. 3: shows two exemplary embodiments of an integrated circuit with a protective diode according to the invention, the breakdown voltage of which is set by means of a particular geometrical arrangement, spatial shape and doping of a plurality of p-conducting zones, partial zones or partial regions. All connections of the semiconductor component and of the protective diode are realized on the same chip surface.
- a) protective diode based on spatially separated partial diodes having a p-type region with zones having a different doping concentration.
- b) protective diodes having a p-type region with zones having a different doping concentration.

DESCRIPTION

Figure 1A:
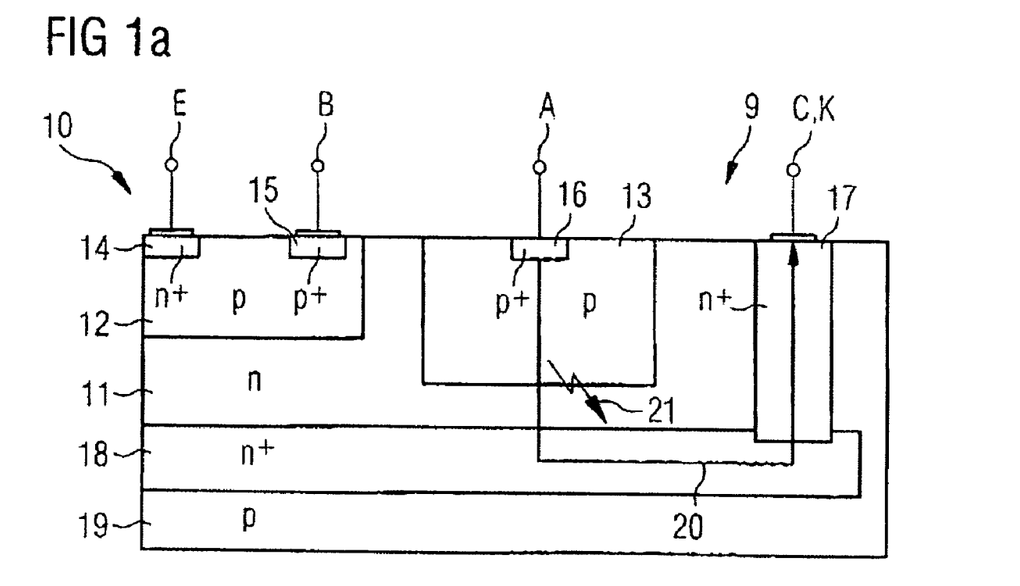

FIG. 1a shows a first exemplary embodiment of an integrated circuit according to the invention. The integrated circuit according to the invention comprises, as active semiconductor component, an npn-bipolar transistor 10 and a protective diode 9. The latter is provided for protecting the npn-bipolar transistor 10 against voltage breakdowns.

In the exemplary embodiment presented in accordance with FIG. 1a npn-bipolar transistor 10 and protective diode 9 are embodied in customary silicon technology. The circuit arrangement is situated on a p-conducting substrate 19, a silicon wafer or the like. An $n^+$-conducting embedding layer 18, a so-called buried layer, is introduced into the p-conducting substrate 19 by ion implantation or diffusion. An epitaxially n-conducting layer 11 is situated on said buried layer 18. Said n-conducting epitaxial layer 11 is formed as an outer n-conducting well into which a p-conducting well 12 for the active semiconductor component, namely the npn-bipolar transistor 10, is introduced for example by ion implantation. This inner p-conducting well 12 is provided with a heavily p-doped base connection zone 15, from which the base connection B is led away. Furthermore, a heavily n-doped emitter zone 14 is introduced as connection for the emitter E into the p-type well 12 by ion implantation or diffusion. The collector C of the npn-transistor is formed by the n-conducting epitaxial layer 11, the contact-connection of which is effected by means of the heavily n-conducting embedding layer 18 and a heavily n-doped connection pillar 17—reaching through the n-conducting outer well 11—to the collector connection C.

In order to prevent a current overloading as a result of breakdown from the inner p-type well 12 forming the base zone to the outer n-type well 11 forming the collector zone, a further p-conducting well 13 is introduced into the n-conducting epitaxial layer 11 at a small distance from the p-type well 12. This further p-type well 13 is superficially provided with a heavily p-doped anode connection zone 16 for contact-connection. Inner p-type well 13 and outer n-type well 11 form a pn junction, that is to say a diode 9. The connections (anode A and cathode K) of said diode 9 are formed on the one hand by the anode connection zone 16 (for the anode A) and on the other hand by the embedding layer 18 and the pillar 17 (for the cathode K). The breakdown voltage of the further p-type well 13 with respect to the outer n-type well 11 is chosen to be less than the breakdown voltage of the inner p-type well 12 of the npn-transistor 10 with respect to the outer n-type well 11.

For operation of the npn-bipolar transistor 10, the anode A of the protective diode 9 is connected up to the bipolar transistor 10 (for example the anode A of the protective diode 9 and the emitter E of the bipolar transistor 10 may be at an identical potential) in such a way that in the case of an overloading of the npn-bipolar transistor 10, on account of a reverse-biasing between the base B and collector C a breakdown 21 is effected between the further p-type well 13 and the outer n-type well 11 and not between the inner p-type well 12 of the bipolar transistor 10 and the outer n-type well 11.

The energy that dissipates during the breakdown 21 is dissipated over the breakdown current path 20 between the p-type well 13, the n-type well 11, the $n^+$-type buried layer 18 and the $n^+$-type pillar 17. Destruction of the npn-bipolar transistor 10 is thereby prevented.

Figure 1B:
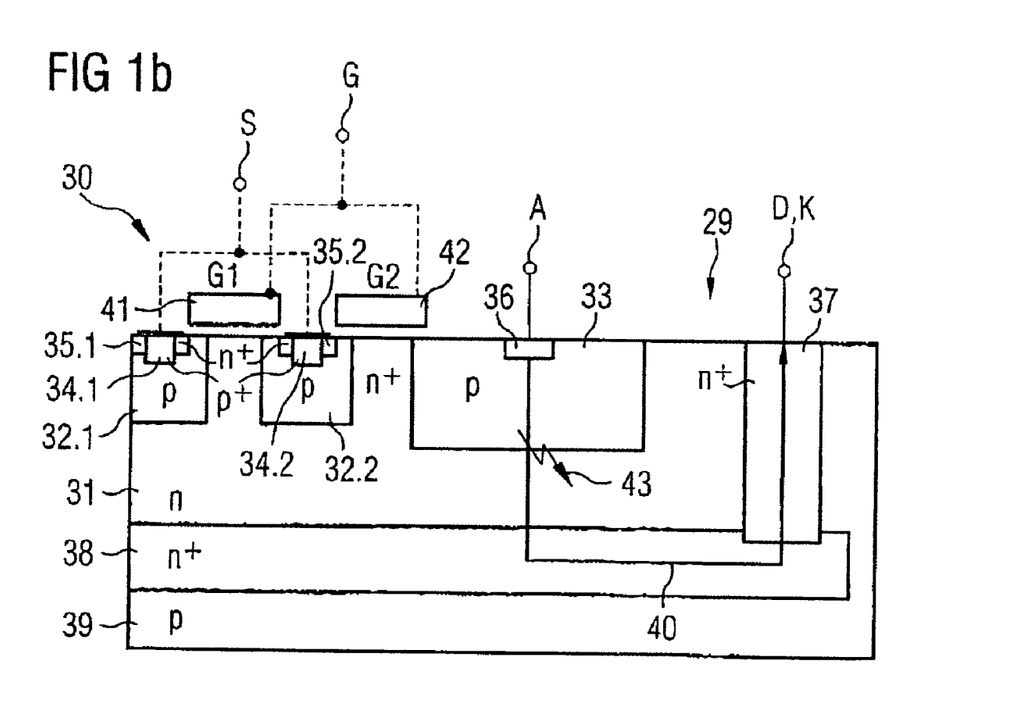

FIG. 1b shows a second exemplary embodiment of an integrated circuit according to the invention. The integrated circuit according to the invention comprises, as active semiconductor component, a VDMOS field effect transistor 30 and an integrated protective diode 29 protecting the VDMOS-FET 30 (FET=acronym for field effect transistor) against voltage breakdowns.

In the exemplary embodiment presented in accordance with FIG. 1b, VDMOS-FET 30 and protective diode 29 are embodied on a silicon wafer. The circuit arrangement is situated on a p-conducting silicon substrate 39. An $n^+$-conducting embedding layer 38 (buried layer) is introduced into the $p^-$-conducting substrate 39 by ion implantation. As in the exemplary embodiment described above, an epitaxial n-conducting layer 31 is situated on said buried layer 38. Said n-conducting epitaxial layer 31 represents an outer n-type well into which two p-conducting wells 32.1, 32.2, so-called bodies, for the FET 30 are introduced (for example by ion implantation). These p-conducting bodies 32.1, 32.2 are provided with heavily p-doped source connection zones 34.1, 34.2, from which source connections S are led away. Furthermore, $n^+$-doped zones 35.1, 35.2 defining a source connection are in each case introduced into the p-conducting bodies 32.1, 32.2 by ion implantation or diffusion. The drain D is formed by the n-conducting epitaxial layer 31, the contact-connection of which is effected by means of the $n^+$-conducting embedding layer 38 and an $n^+$-doped connection pillar 37—reaching through the n-conducting epitaxial layer 31—to the up-drain connection D. Furthermore, a gate G, G1, G2 comprising two gate contacts 41, 42 is provided.

In order to prevent a breakdown from the p-type wells 32.1, 32.2 to the n-type well 31, a further p-conducting well 33 is introduced into the n-conducting epitaxial layer 31 at a small distance from the p-type wells 32.1, 32.2. This further p-type well 33 is superficially provided with a $p^+$-doped connection zone 36 for contact-connection. The further p-type well 33 and the outer n-type well 31 form a pn junction defining the abovementioned protective diode 29. The connections A, K of said protective diode 29 are formed on the one hand by the anode connection zone 36 (for the anode A) and on the other hand by the embedding layer 38 and the pillar 37 (for the cathode K).

The breakdown voltage of the further p-type well 33 with respect to the outer n-type well 31 is chosen to be less than the breakdown voltage of the p-type wells 32.1, 32.2 with respect to the outer n-type well 31.

For operation of the field effect transistor 30, the anode A of the protective diode 29 is connected up to the field effect transistor 30 (for example the anode A of the protective diode 29 and the source connection S of the field effect transistor 30 may be at an identical potential) in such a way that, in the case of an overloading of the field effect transistor 30, on account of a current loading between body 32.1, 32.2 and up-drain D, a breakdown 41 is effected between the further p-type well 33 and the outer n-type well 31 and not between the p-type bodies 32.1, 32.2 of the field effect transistor 30 and outer n-type well 31.

The energy that is dissipated during the breakdown 41 is dissipated over the breakdown current path 40 between the p-type well 33, the n-type well 31, the $n^+$-type buried layer 38 and the $n^+$-type pillar 37. Destruction of the field effect transistor 30 is thereby effectively prevented.

Figure 1C:
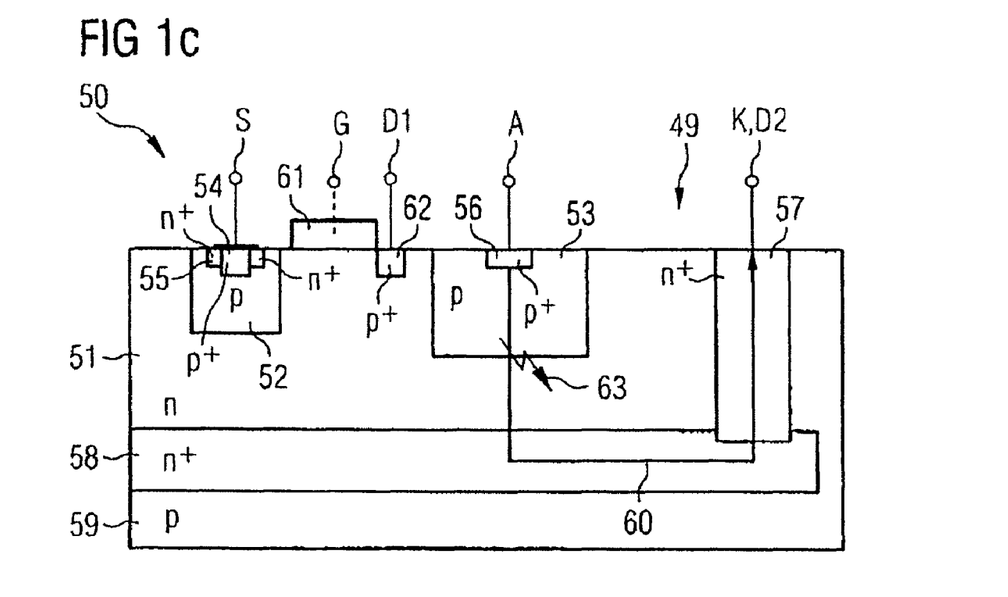

FIG. 1c shows a third exemplary embodiment of an integrated circuit according to the invention. The integrated circuit according to the invention comprises, as active semiconductor component, an LDMOS field effect transistor 50 and an integrated protective diode 49 protecting the LDMOS-FET 50 against voltage breakdowns.

In the exemplary embodiment presented in accordance with FIG. 1c, LDMOS-FET 50 and protective diode 49 are embodied in a similar manner to the VDMOS-FET 30 and the protective diode 29 corresponding to FIG. 1b.

The circuit arrangement is situated on a p-conducting silicon substrate 59. An $n^+$-conducting buried layer 58 is introduced into the $p^-$-conducting substrate 59. As in the exemplary embodiment described above, an epitaxial n-type layer 51 is situated on said buried layer 58. A p-conducting body 52 for the FET 50 is introduced into said n-type epitaxial layer 51. The body 52 is provided with a $p^+$-doped body connection zone 54, from which a source connection S is led away. Furthermore, an $n^+$-conducting source zone 55 is introduced into the body 52. Two drain connections D1, D2 with corresponding $n^+$-type drain zones 62, 57 introduced into the n-type epitaxial layer 51 are provided. A gate G with gate contact G1 is also provided.

In order to prevent a breakdown from the p-type body 52 to the n-type well 51, a further p-conducting well 53 is introduced into the n-conducting epitaxial layer 51 at a small distance from the $n^+$-type drain zones 62, 57. Said further p-type well 53 is superficially provided with a $p^+$-doped anode connection zone 56 for contact-connection. The further p-type well 53 and the outer n-type well 51 form a pn junction defining the abovementioned protective diode 49. The connections A, K of said protective diode 49 are formed on the one hand by the anode connection zone 56 (for the anode A) and on the other hand by the embedding layer 58 and the pillar 57 (for the cathode K).

As in the previous exemplary embodiment, the breakdown voltage of the further p-type well 53 with respect to the outer n-type well 51 is chosen to be smaller than the breakdown voltage of the p-type well 52 with respect to the outer n-type well 51.

For operation of the field effect transistor 50, the anode A of the protective diode 49 is again connected up to the field effect transistor 50 (for example the anode A of the protective diode 49 and the source connection S of the field effect transistor 50 may be at an identical potential as in the previous exemplary embodiment) in such a way that, in the case of an overloading of the field effect transistor 50, on account of a reverse-biasing between body 52 and drain D1, D2, a breakdown 61 is effected between the further p-type well 53 and the outer n-type well 51 and not between the p-type body 52 of the field effect transistor 50 and the outer n-type well 51.

The energy that is dissipated during the breakdown 61 is dissipated over the breakdown current path 60 between the p-type well 53, the n-type well 51, the $n^+$-type buried layer 58 and the $n^+$-type pillar 57. Destruction of the field effect transistor 50 is effectively prevented in this way.

In the case of a vertical technology (as presented previously) with integrated components (SMART technology), the contact-connection of the collector may also be effected on the rear side of the wafer. The protective pn junction may then be configured as part of the edge termination.

One or more p-type wells of the active semiconductor structure may lie within the outer n-type well, which p-type wells may be arranged for instance in the form of cells or strips (as is customary in the case of DMOS transistors). Equally, the integrated protective diode may comprise one or more p-type wells which may be adjacent in an arbitrary arrangement with respect to the p-type wells of the active component.

Figure 2:
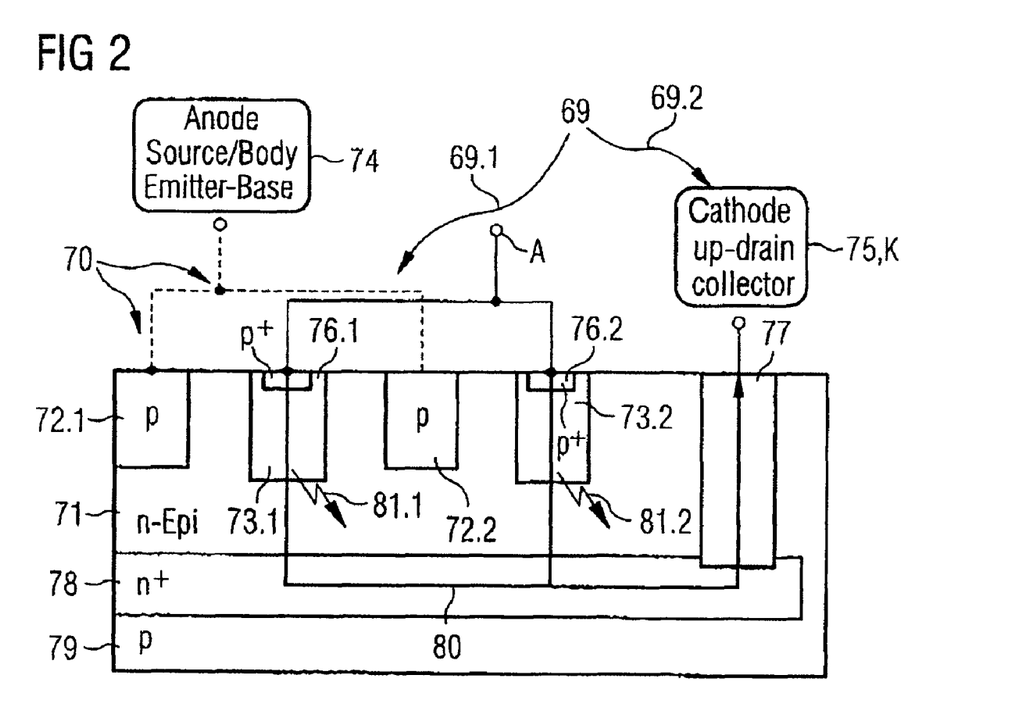
FIG. 2: shows an exemplary embodiment of an integrated circuit with a protective diode according to the invention based on spatially separated partial diodes. All connections of the semiconductor component and of the protective diode are realized on the same chip surface.

FIG. 2 shows an exemplary embodiment in which the integrated protective diode 69 comprises a plurality of p-type wells 81.1, 82.2.

The integrated circuit according to the invention in accordance with FIG. 2 comprises, as active semiconductor component 70, either an npn-bipolar transistor (like the circuit in accordance with FIG. 1a), a field effect transistor or a diode and also a protective diode 69 which is provided for protecting the semiconductor component 70 against voltage breakdowns.

In the exemplary embodiment presented in accordance with FIG. 2, the semiconductor component 70 is embodied in a similar manner to the field effect transistor 30 corresponding to FIG. 1b.

The circuit arrangement is situated on a p-conducting silicon substrate 79. An n⁺-conducting buried layer 78 is introduced into the p⁻-conducting substrate 79. An epitaxial n-type layer 71 is situated on said buried layer 78. Two p-conducting wells 72.1, 72.2 for the semiconductor component 70 are introduced into said n-type epitaxial layer 71. Said wells 72.1, 72.2 may be bodies of a field effect transistor, emitter/base zones of a bipolar transistor or anode zones of a diode. It goes without saying that these may be provided with corresponding p⁺-doped connection zones, from which corresponding source connections, emitter and base connections or anode connections 74 are led away. Other regions zones having an identical or different doping and/or doping concentrations may be provided, but are not illustrated in the drawing.

Collector, up-drain or cathode of the semiconductor component 70 is formed by the n-conducting epitaxial layer 71, the contact-connection of which is effected by means of the n⁺-conducting embedding layer 78 and an n⁺-doped connection pillar 77—reaching through the n-conducting outer well 71—to the collector, up-drain or to the cathode of the active semiconductor component 70. The corresponding connection is identified by the reference symbol 75 in the figure of the drawing.

In order to prevent a current loading as a result of a breakdown from the p-type wells 72.1, 72.2 to the n-type well 71, two further p-conducting wells 73.1, 73.2 are introduced into the n-conducting epitaxial layer 71 at a small distance from the p-type well 72.1, 72.2. Said p-type wells 73.1, 73.2 are in each case superficially provided with a heavily p-doped anode connection zone 76.1, 76.2 for contact-connection. The two p-type wells 73.1, 73.2 and the n-type well 71 in each case form a pn junction, that is to say diodes 69.1, 69.2. The connections of said diodes 69.1, 69.2 are formed on the one hand by the anode connection zones 76.1, 76.2 (for the anodes A connected to one another in the exemplary embodiment) and on the other hand by the embedding layer 78 and the pillar 77 (for the cathode K). A single diode 69 is formed by the electrical connection of the anodes of the two partial diodes 69.1, 69.2.

The breakdown voltage of the further p-type wells 73.1, 73.2 with respect to the outer n-type well 71 is again chosen to be less than the breakdown voltage of the p-type wells 72.1, 72.2 with respect to the outer n-type well 71.

The semiconductor component 70 is now connected up externally to the anode A of the protective diode 69 (for example the anode A of the protective diode 69 and the emitter E of the semiconductor component 70 embodied as a bipolar transistor may be at an identical potential) in such a way that, in the case of an overloading of the semiconductor component 70, on account of a reverse-biasing between well 72.1 and/or 72.2 and well 71, a breakdown 81.1, 81.2 is effected between the further p-type wells 73.1, 73.2 and the outer n-type well 71 and not between the p-type wells 72.1, 72.2 of the semiconductor component 70 and the outer n-type well 71.

The energy that is dissipated during the breakdown 81.1, 81.2 is dissipated over the breakdown current path 80 between the p-type wells 73.1, 73.2, the n-type well 71, the n⁺-type buried layer 78 and the n⁺-type pillar 77. Destruction of the semiconductor component 70 is prevented.

The possible splitting and distribution of the breakdown source within the active area of the component to be protected (see FIG. 2 for example) has the advantage of distributing the heat in the case of long pulses of relatively high energy (such as the so-called ISO pulses according to ISO 7637-3) better in the silicon.

The breakdown of the protective pn junction may also be controlled by layout measures, such as, for instance, spacing and width of adjacent p-type regions. Two exemplary embodiments in which the breakdown has been set in a targeted manner are illustrated in FIGS. 3a and 3b.

Figure 3A:
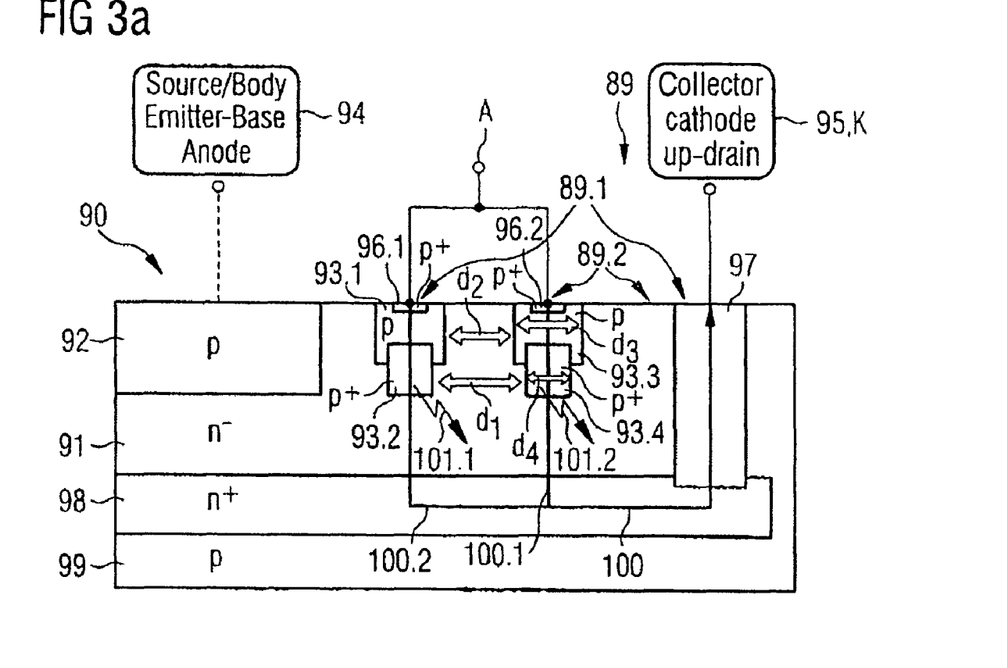
Figure 3B:
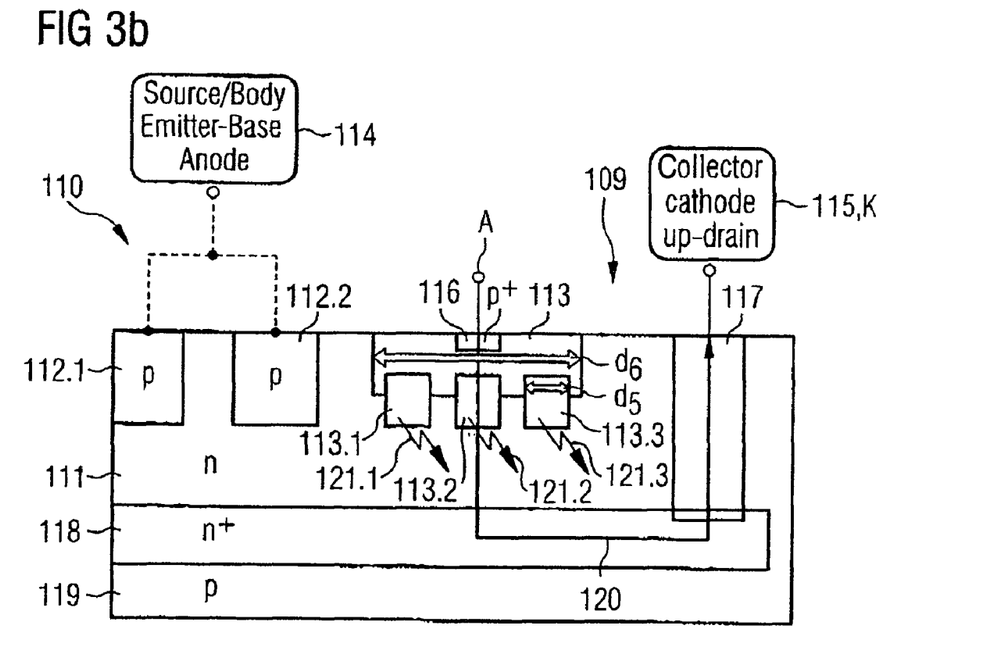

The circuit arrangement in accordance with FIG. 3a is situated on a p⁻-conducting silicon substrate 99. An n⁺-conducting buried layer 98 is introduced into the p⁻-conducting substrate 99. An epitaxial n-type layer 91 is situated on said buried layer 98. A p-conducting well 92 for a semiconductor component 90 is introduced into said n-type epitaxial layer 91. Said well 92 may again be the body of a field effect transistor, an emitter/base zone of a bipolar transistor or an anode zone of a semiconductor diode. It goes without saying that these may be provided with corresponding p⁺-doped connection zones, from which corresponding source connections, emitter and base connections or anode connections 94 are led away. Other regions/zones having an identical or different doping and/or doping concentrations may be provided but are not illustrated in the drawing.

Collector, up-drain or cathode of the semiconductor component 90 is formed, as in the previous exemplary embodiment, by the n⁻-conducting epitaxial layer 91, the contact-connection of which is effected by means of the n⁺-conducting embedding layer 98 and an n⁺-doped connection pillar 97—reaching through the n-conducting outer well 91—to the collector, up-drain or to the cathode of the active semiconductor component 90. The corresponding connection is identified by the reference symbol 95 in the figure of the drawing.

In order to prevent a breakdown from the p-type well 92 to the n-type well 91, two further p-conducting wells 93.1, 93.3 are introduced into the n-conducting epitaxial layer 91 at a small distance from the p-type well 92. Said p-type wells 93.1, 93.3 are in each case superficially provided with a heavily p-doped anode connection zone 96.1, 96.2 for contact-connection. Furthermore, two further p-type wells 93.2, 93.4 adjoin the abovementioned p-type wells 93.1, 93.3. The further p-type wells 93.1, 93.2, 93.3, 93.4 and the n-type well 91 in each case form a pn junction, that is to say diodes 89.1, 89.2. The connections of said diodes 89.1, 89.2 are formed on the one hand by the anode connection zones 96.1, 96.2 (for the anodes A connected to one another in the exemplary embodiment) and on the other hand by the embedding layer 98 and the pillar 97 (for the cathode K). A single diode 89 is formed by the electrical connection of the anodes of the two partial diodes 89.1, 89.2.

The breakdown voltage of the further p-type wells 93.1, 93.2, 93.3, 93.4 with respect to the outer n-type well 91 is again chosen to be less than the breakdown voltage of the p-type wells 92.1, 92.2, with respect to the outer n-type well 91. Through skillful selection of the dimensions $d_3$, $d_4$ of the p-type wells 93.1, 93.2, 93.3, 93.4 and the distances $d_1$, $d_2$ between the latter, the breakdown voltage of the protective diode 89 comprising two partial diodes can be set exactly to a desired value.

The semiconductor component 90 is now connected up externally to the anode A of the protective diode 89 (for example the anode A of the protective diode 89 and the anode of the semiconductor component 90 embodied as a diode may be at an identical potential) in such a way that, in the case of an overloading of the semiconductor component 90, on account of a reverse-biasing between well 92 and well 91, a breakdown 101.1, 101.2 is effected between the further p-type wells 93.1, 93.2, 93.3, 93.4 and the outer n-type well 91 and not between the p-type well 92 of the semiconductor component 90 and the outer n-type well 91.

The energy that is dissipated during the breakdown 101.1, 101.2 is dissipated over the breakdown current path 100, in particular the breakdown current partial paths 100.1, 100.2 between the p-type wells 93.1, 93.2, 93.3, 93.4, the n-type well 91, the $n^+$-type buried layer 98 and the $n^+$-type pillar 97. Destruction of the semiconductor component 90 is prevented.

The exemplary embodiment illustrated in FIG. 3b comprises a semiconductor component such as has already been shown in FIG. 2.

The semiconductor component 110 is situated on a p-conducting silicon substrate 119. An $n^+$-conducting buried layer 118 is introduced into the $p^-$-conducting substrate 119. An epitaxial n-type layer 111 is again situated on said buried layer 118. Two p-conducting wells 112.1, 112.2 for the semiconductor component 110 are introduced into said n-type epitaxial layer 111. Said wells 112.1, 112.2 may be bodies of a field effect transistor, emitter/base zones of a bipolar transistor or anode zones of a diode. It goes without saying that these may be provided with corresponding $p^+$-doped connection zones, from which corresponding source connections, emitter and base connections or anode connections 114 are led away. Other regions/zones having an identical or different doping and/or doping concentrations may be provided, but are not illustrated in the drawing.

Collector, up-drain or cathode of the semiconductor component 110 is formed by the n-conducting epitaxial layer 111, the contact-connection of which is effected by means of the $n^+$-conducting embedding layer 118 and an $n^+$-doped connection pillar 117—reaching through the n-conducting outer well 111—to the collector, up-drain or to the cathode of the active semiconductor component 110. The corresponding connection is identified by the reference symbol 115 in the figure of the drawing.

In order to prevent a breakdown from the p-type wells 112.1, 112.2 to the n-type well 111, four further p-conducting wells 113, 113.1, 113.2, 113.3 are introduced into the n-conducting epitaxial layer 111 at a small distance from the p-type well 112.1, 112.2. The p-type wells 113.1, 113.2, 113.3 are connected to one another by the p-type well 113. The p-type well 113 is superficially provided with a heavily p-doped anode connection zone 116 for contact-connection. The p-type wells 113, 113.1, 113.2, 113.3 and the n-type well 111 in each case form a pn junction. Since the p-type wells 113, 113.1, 113.2, 113.3 are connected to one another, the sum of the abovementioned pn junctions represents a diode 109. The connections of said diode 109 are formed on the one hand by the anode connection zone 116 (for the anode A) and on the other hand by the embedding layer 118 and the pillar 117 (for the cathode K).

The breakdown voltage of the further p-type wells 113, 113.1, 113.2, 113.3 with respect to the outer n-type well 111 is again chosen to be less than the breakdown voltage of the p-type wells 112.1, 112.2 with respect to the outer n-type well 111.

The semiconductor component 110 is now again connected up externally to the anode A of the protective diode 109 (for example the anode A of the protective diode 109 and the emitter E of the semiconductor component 110 embodied as a bipolar transistor may be at an identical potential) in such a way that in the case of an overloading of the semiconductor component 110, on account of a reverse-biasing between well 112.1 and/or 112.2 and well 111, a breakdown 121.1, 121.2, 121.3 is effected between the further p-type wells 113.1, 113.2, 113.3 and the outer n-type well 111 and not between the p-type wells 112.1, 112.2 of the semiconductor component 110 and the outer n-type well 111.

The energy that is dissipated during the breakdown 121.1, 121.2, 121.3 is dissipated over the breakdown current path 120 between the p-type wells 113.1, 113.2, 113.3, the n-type well 111, the $n^+$-type buried layer 118 and the $n^+$-type pillar 117. Destruction of the semiconductor component 110 is reliably prevented. The breakdown voltage and the volume in which the energy is dissipated during a breakdown are determined by the dimensions $d_5$, $d_6$ of the p-type wells 113, 113.1, 113.2, 113.3, the geometrical arrangement thereof with respect to one another and the geometrical shape thereof. These variables can therefore (largely) be chosen freely.

In a further embodiment, the component to be protected contains an outer p-type well (n-type well). The component breakdown to be protected is effected relative to an n-type region (p-type region) which is integrated in the outer p-type well (n-type well) and is connected to the semiconductor surface.

An NMOS transistor which is integrated into an outer p-type well and whose p-type well (bulk)/drain breakdown is to be protected shall be mentioned by way of example. A PMOS transistor which is integrated into an outer n-type well and whose n-type well (bulk)/drain breakdown is to be protected shall likewise be mentioned by way of example.

A plurality of active (semiconductor) components may likewise be situated in the p-type well (n-type well). The components integrated into the outer p-type well (n-type well) are defined by further p-type or n-type regions within the well (for instance a further n-type region in the p-type well, which serves as source connection of an NMOS transistor). According to the invention, a further diode breakdown is integrated into the outer p-type well (n-type well), the breakdown voltage of said further diode breakdown lying below that of the well breakdown with respect to the active component. For this purpose, use is made of one or more n-type and/or p-type wells within the outer p-type well (n-type well) which serve for setting the breakdown voltage of the protective diode and the connection thereof to the semiconductor surface.

Figure 4:
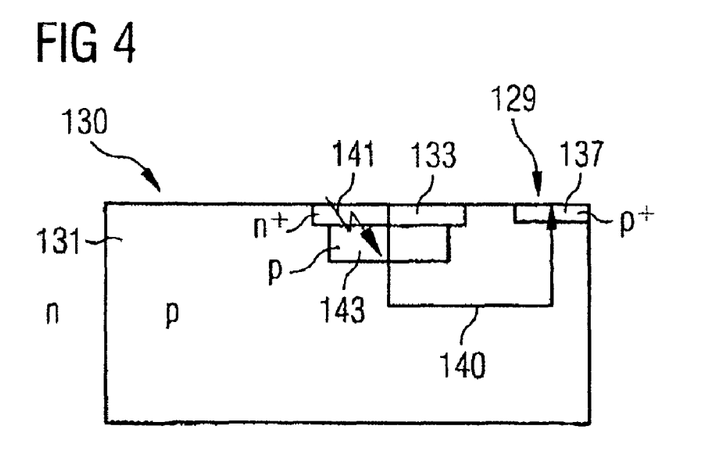
FIG. 4: shows an exemplary embodiment of an integrated circuit with a protective diode according to the invention, the pn junction of which is arranged completely within a well of a semiconductor component that defines a first p-conducting region. All connections of the semiconductor component and of the protective diode are realized on the same chip surface.

A preferred embodiment according to the invention is illustrated in FIG. 4. Additional n-type and p-type wells 133, 143, 137, which serve for connecting the protective diode 129 to the semiconductor surface, are integrated within a p-type well 131—enclosed for example by an n-type region—of the active component(s) 130.

One or both of these connections may also optionally be shared with the connection of an active component. The setting of the breakdown voltage of the p-type well 131 with respect to the connection of the n-type region 133 (e.g. drain of an NMOS) is effected by means of an additional p-type well 143. For the sake of completeness, FIG. 4 depicts the location of the breakdown 141 and the breakdown current path 140 for the case of breakdown of the protective diode 129.

Figure 5:
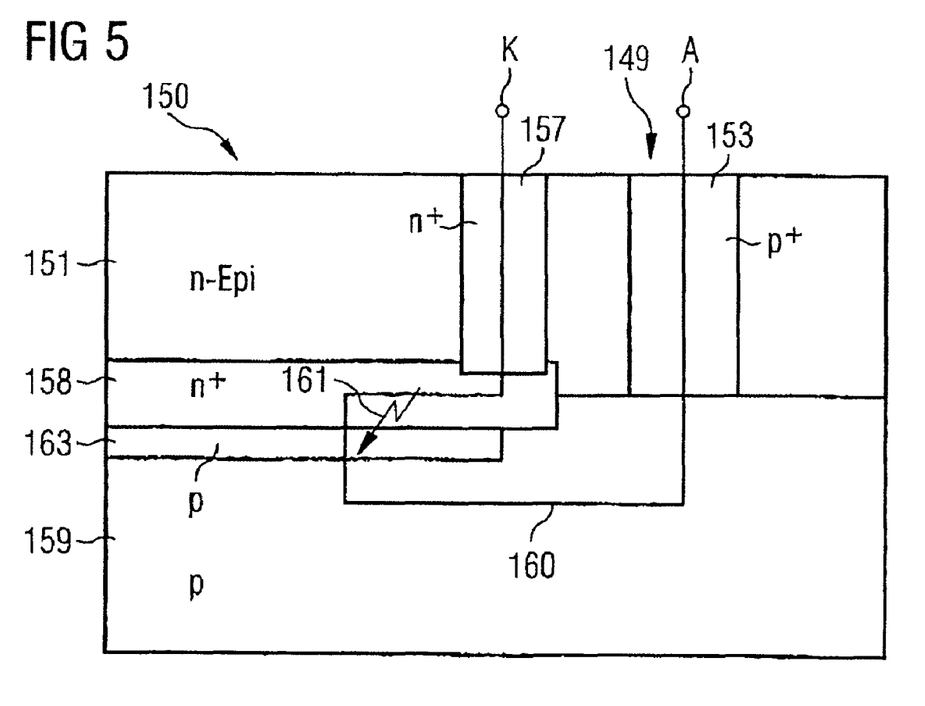
FIG. 5: shows an exemplary embodiment of an integrated circuit with a protective diode according to the invention, the pn junction of which is formed by a heavily n-conducting buried layer and an underlying especially p-doped layer of a p-conducting substrate. All connections of the semiconductor component and of the protective diode are realized on the same chip surface.

In another embodiment, which is illustrated in FIG. 5, the anode of the protective diode is not integrated within an outer n-type well 151, rather a breakdown 161 to a substrate 159 of the p-conductivity type serves for protecting the active component. The breakdown of the outer n-type well 151 with respect to an inner (not illustrated) p-type well (for instance a body connection of a VDMOS transistor) is intended to be protected.

The setting of the breakdown voltage can be realized for instance by means of a p-type implantation prior to the processing of the outer n-type well. The anode may be connected to the contact-connected rear side of the wafer or for instance (illustrated in FIG. 5) may be led to the surface via the insulation implantations 153 for isolating adjacent components. As in the previous exemplary embodiments, the cathode connection may be produced by means of a pillar 157 reaching to a buried layer 158.

The p-type implantation 163 prior to the processing of the outer n-type well 151 need not be effected in planar fashion, but rather may be effected by means of a plurality of p-type regions of arbitrary form (round, polygonal) which are arranged at an arbitrary distance from one another (not illustrated). The distance is oriented to the outdiffusion of the implanted p-type well in a preferred embodiment.

LIST OF REFERENCE SYMBOLS

1 Low-side switching transistor (n-channel MOSFET)
2 Ground connection
3 Operating voltage connection
4 Zener diode chain
9 Protective diode
10 npn-Bipolar transistor
11 Outer well (collector zone)
12 Inner well (base zone)
13 Further inner well (anode)
14 Emitter zone
15 Base connection zone
16 Anode connection zone
17 Connection pillar
18 Embedding layer/buried layer
19 Substrate
20 Breakdown current path
21 Breakdown
29 Protective diode
30 VDMOS transistor
31 Outer well (drain zone)
32.1 First inner well (first body)
32.2 Second inner well (second body)
33 Further inner well (anode)
34.1 First body connection
34.2 Second body connection
35.1 Source zone
35.2 Source zone
36 Anode connection zone
37 Connection pillar
38 Embedding layer/buried layer
39 Substrate
40 Breakdown current path
41 Gate contact
42 Gate contact
43 Breakdown
49 Protective diode
50 LDMOS transistor
51 Outer well
52 Inner well (body)
53 Further inner well (anode)
54 Body connection
55 Source connection
56 Anode connection zone
57 Connection pillar
58 Embedding layer/buried layer
59 Substrate
60 Breakdown current path
61 Gate
62 Drain zone of the first drain
63 Breakdown
69 Protective diode
69.1 Partial diode
69.2 Partial diode
70 Circuit to be protected/pn junctions
71 Outer well
72.1 First inner well
72.2 Second inner well
73.1 First further well
73.2 Second further well
74 First connection
75 Second connection
76.1 First anode connection zone
76.2 Second anode connection zone
77 Connection pillar
78 Embedding layer/buried layer
79 Substrate
80.1 First part of breakdown current path
80.2 Second part of breakdown current path
81.1 Breakdown
81.2 Breakdown
89.1 First protective partial diode
89.2 Second protective partial diode
89 Protective diode
90 Circuit to be protected/pn junctions
91 Outer well
92 Inner well
93.1 First further well
93.2 Second further well
93.3 Third further well
93.4 Fourth further well
94 First connection
95 Second connection
96.1 First anode connection zone
96.2 Second anode connection zone
97 Connection pillar
98 Embedding layer/buried layer
99 Substrate
100 Breakdown current path
100.1 Partial path
100.2 Partial path
101.1 Breakdown
101.2 Breakdown
109 Protective diode
110 Circuit to be protected/pn junction/bipolar parasitic
111 Outer well 112.1 First inner well
112.2 Second inner well
113 Further well
113.1 First further well
113.2 Second further well
113.3 Third further well
114 First connection
115 Second connection
116 Anode connection zone
117 Connection pillar
118 Embedding layer/buried layer
119 Substrate
120 Breakdown current path
121.1 First breakdown
121.2 Second breakdown
121.3 Third breakdown
129 Protective diode
130 pn junction to be protected/bipolar parasitic
131 Outer well (with active components not illustrated)
133 Further inner n$^+$-type region
137 Inner p$^+$-type region
140 Breakdown current path
141 Breakdown
143 p-type well for setting the breakdown
149 Protective diode
150 Circuit to be protected
151 Outer well (with further p-type and n-type wells of the active components (not illustrated))
153 Substrate connection
157 n-type well connection of the active components
158 Embedding layer/buried layer
159 Substrate
160 Breakdown current path
161 Breakdown
163 Additional p-type region
$d_1$-$d_6$ Distances
B Base
E Emitter
C Collector
A Anode
K Cathode
VDMOS-FET Power field effect transistor with double diffused vertical structure
LDMOS-FET Power field effect transistor with double diffused lateral structure
Z1 Zener diode
Z2 Zener diode
Z3 Zener diode
Z4 Zener diode
KD1 Coupling diode
L Inductance
$R_{GS}$ Gate-source resistance
G Gate
G1 First gate
G2 Second gate
S Source
D1 First drain
D2 Second drain
D Drain
IC Integrated circuit
ESD Electrostatic discharge
HBM Human body model
n Conductivity type
p Conductivity type

The invention claimed is:

1. An integrated circuit including a semiconductor component, the integrated circuit comprising:

a) a first p-type region forming a body region of a field effect transistor;
b) a first n-type region adjoining the first p-type region and forming a drain region of the field effect transistor, the first p-type region and the first n-type region together forming a first pn junction; and
c) a further p-type region spaced apart from the first p-type region, the further p-type region adjoining the first n-type region and forming a further pn junction,
wherein the first p-type region of the first pn junction and the further p-type region of the further pn junction are operably connected to an identical potential,
wherein the first p-type region has a first breakdown voltage with respect to the first n-type region and the further p-type region has a further breakdown voltage with respect to the first-n type region,
wherein the further breakdown voltage is less than the first breakdown voltage such that, in the case of an overloading of the semiconductor component on account of reverse biasing of the first pn junction, the further pn junction is the first to break down relative to the first pn junction
wherein the field effect transistor comprises a VDMOS;
wherein the intergrated circuit further comprises a second p-type region spaced apart from both the first p-type region and the further p-type region, the second p-type region being operably coupled to the first p-type region and forming a second body region for the VDMOS, the second p-type region and the first n-type region adjoining to form a second pn junction
wherein the second p-type region has a second breakdown voltage with respect to the first n-type region, the further breakdown voltage being less than the second breakdown voltage.

2. The integrated circuit of claim 1 wherein additional p-type regions or n-type regions defining the semiconductor component are arranged within the first p-type region or within the first n-type region.

3. The integrated circuit of claim 1 wherein the first p-type region is a body region of a field effect transistor.

4. The integrated circuit of claim 1 wherein the further p type region is an anode region and the first n-type region is a cathode region of a diode.

5. The integrated circuit of claim 1 wherein the first pn junction and the further pn junction have one common connection contact or two common connection contacts.

6. The integrated circuit of claim 1 wherein the further p-type region includes a plurality of zones having different doping concentrations.

7. The integrated circuit of claim 6 wherein the further breakdown voltage value of the further pn junction is set to a predetermined value by the spatial arrangement of the plurality of zones.

8. The integrated circuit of claim 6 wherein the further breakdown voltage value of the further pn junction is set to a predetermined value by the doping concentrations of the plurality of zones with respect to one another.

9. The integrated circuit of claim 6 wherein the further breakdown voltage value of the further pn junction is set to a predetermined value by the geometrical shape of the plurality of zones.

10. The integrated circuit of claim 1 wherein the semiconductor component is a low-side switch.

* * * * *